United States Patent [19]
Liang

[11] Patent Number: 6,083,786
[45] Date of Patent: Jul. 4, 2000

[54] METHOD FOR FABRICATING A LOAD IN A STATIC RANDOM ACCESS MEMORY

[75] Inventor: Kuei-Chang Liang, Taipei Hsien, Taiwan

[73] Assignee: Winbond Electronics Corp., Hsinchu, Taiwan

[21] Appl. No.: 08/938,118

[22] Filed: Sep. 26, 1997

[30] Foreign Application Priority Data

Aug. 28, 1997 [TW] Taiwan ................... 86112359

[51] Int. Cl.⁷ ............................................. H01L 21/8234
[52] U.S. Cl. .................. 438/238; 438/238; 438/268; 438/270; 438/152; 437/47; 437/48; 437/67
[58] Field of Search ...................... 438/238, 241

[56] References Cited

U.S. PATENT DOCUMENTS

5,866,451  2/1999  Yoo et al. .................... 438/241
5,879,971  3/1999  Witek ............................ 438/238

*Primary Examiner*—David Nelms
*Assistant Examiner*—Pho Luu
*Attorney, Agent, or Firm*—Ladas & Parry

[57] ABSTRACT

A method for fabricating a load on a substrate is disclosed. The method includes the steps of: forming a dielectric layer over the substrate; patterning the dielectric layer to form a window in which a portion of the substrate is exposed; forming a metal plug in the window; forming a conducting layer over the substrate; thermally processing the metal plug and the conducting layer, thereby forming a silicide interface; and defining a predetermined length of the conducting layer from the silicide interface as a load.

20 Claims, 12 Drawing Sheets

METHOD FOR FABRICATING A LOAD IN A STATIC RANDOM ACCESS MEMORY

BACKGROUND OF THE INVENTION

1. Field of the Invention

The present invention relates to a static random access memory (SRAM), and more specifically, to an SRAM in which a silicide interface is utilized to separate a load and a connector.

2. Description of Related Art

The SRAM has the highest operating rate of all memory devices. Therefore it is applicable in many fields such as cache memory for data processing. For example, in a digital device such as a minicomputer or microprocessor, the role of the SRAM has been recognized.

Figure 1:
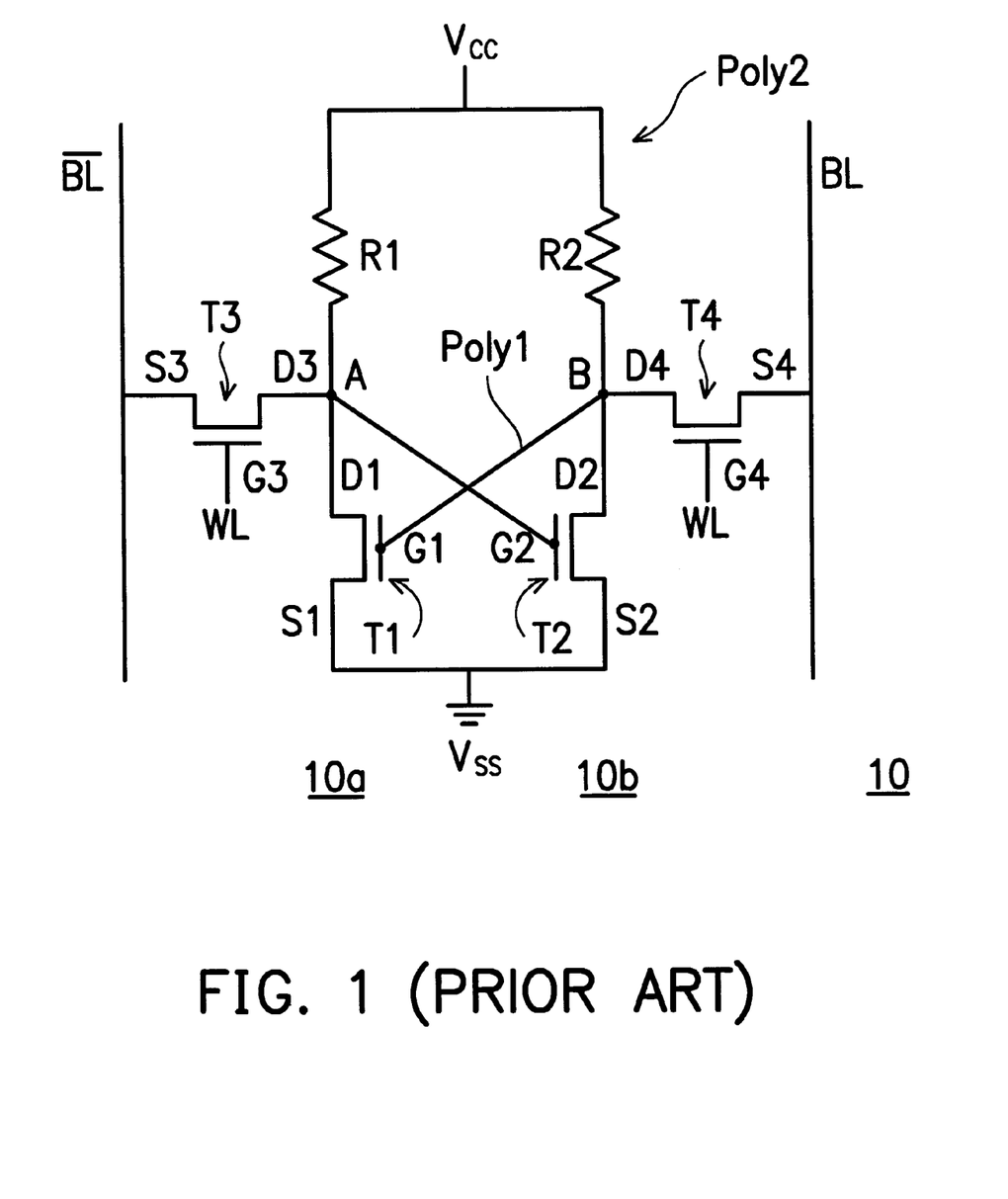
FIG. 1 is a circuit diagram illustrating a conventional memory unit which includes four MOS transistors.

Referring to FIG. 1, a typical SRAM memory unit 10 includes two resistors (or loads) R1 and R2, and four MOS transistors T1, T2, T3 and T4. The resistor R1 and MOS transistor T1 constitute a series circuit 10a in which the two terminals are connected to a voltage source Vcc and grounded to Vss, respectively. Similarly, the resistor R2 and transistor T2 form a series circuit 10b which is connected between the voltage source Vcc and ground Vss. The series circuits and the voltage sources are connected through semiconductor process, thereby forming the memory cell 10.

Moreover, gate G2 of the transistor T2, drain D1 of transistors T1 and drain D3 of transistor T3 are connected at node A. The gate G1 of transistor T1, drain D2 of transistor T2 and drain D4 of transistor T4 are connected at node B. Gate G3 of transistor T3 and gate G4 of transistor T4 are connected together to a word line WL. Source S3 of transistor T3 and source S4 of transistor T4 are connected to a bit line BL and a complementary bit line $\overline{BL}$. The transistors can be enhanced-mode NMOS transistors, wherein transistors T1 and T2 are provided for drivers, and transistors T3 and T4 are transfer transistors. The resistors R1 and R2 are loads for reducing leakage currents at nodes A and B.

Since the aforementioned memory unit requires four transistors, the integrity is lower than with other memory devices. Especially when a sub-micron technology is applied, the SRAM process always encounters the problem of insufficient margin. The large area occupied by the loads (R1, R2) is a principle reason.

Figure 2A:
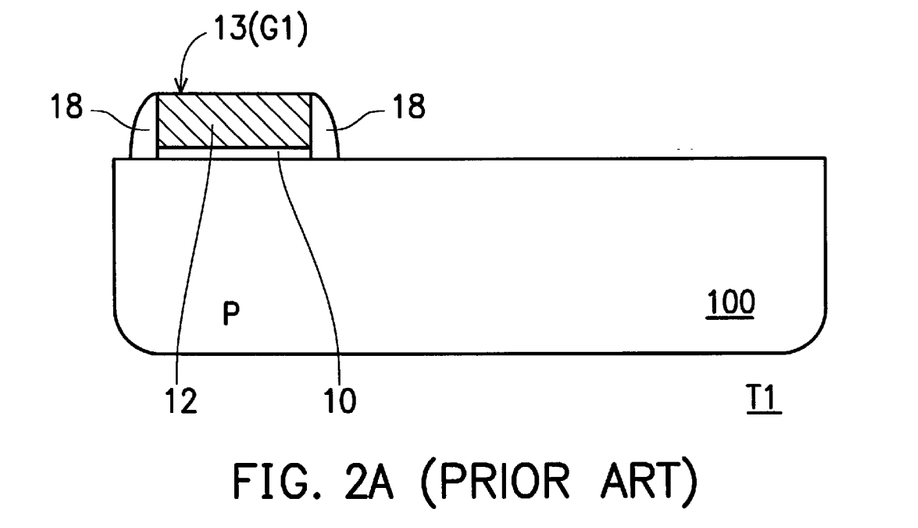
FIG. 2A through FIG. 2D are cross-sectional views illustrating the steps to form a load in the memory unit of FIG. 1.
Figure 2B:
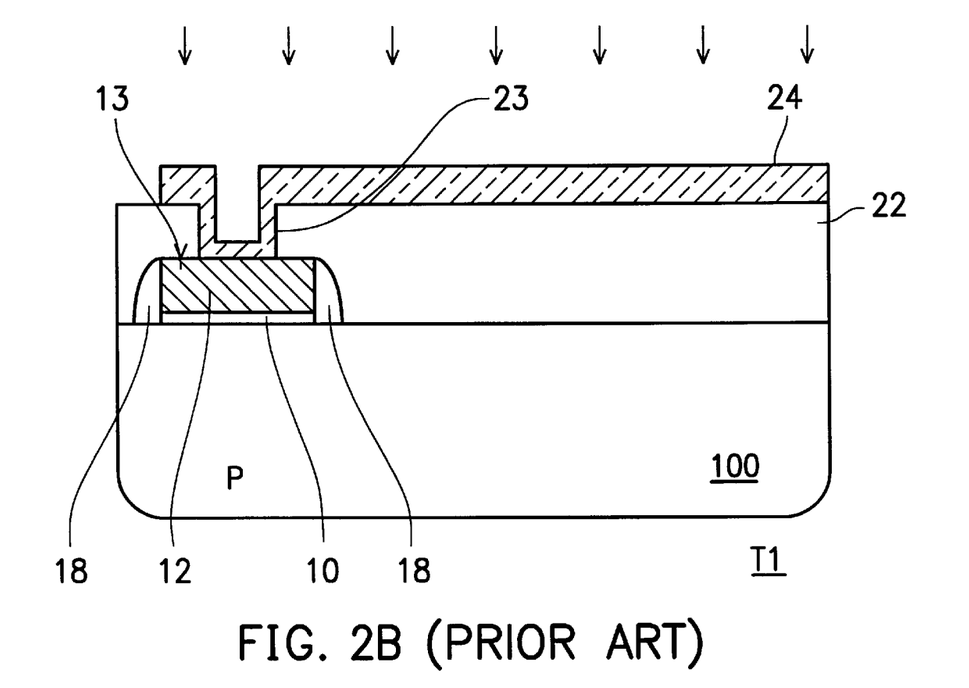

FIG. 2A through 2D are cross-sectional views of the SRAM memory unit 10. Referring to FIG. 2A, a P-well is formed in a semiconductor substrate 100 for fabricating the transistor T1 thereon. The transistor T1, which is formed by a conventional method, includes a polysilicon gate 13 (G1), a gate insulating layer 10 and a dielectric spacer 18 on sidewall of the gate. Referring to FIG. 2B, an insulating layer 22 is formed over the transistor T1. The insulating layer 22 is defined to form a dielectric window 23 in which a portion of the gate 13 is exposed. The substrate and the dielectric window 23 are then covered by a polysilicon layer 24, which is implanted with N impurities, and is patterned as a load.

Figure 2C:
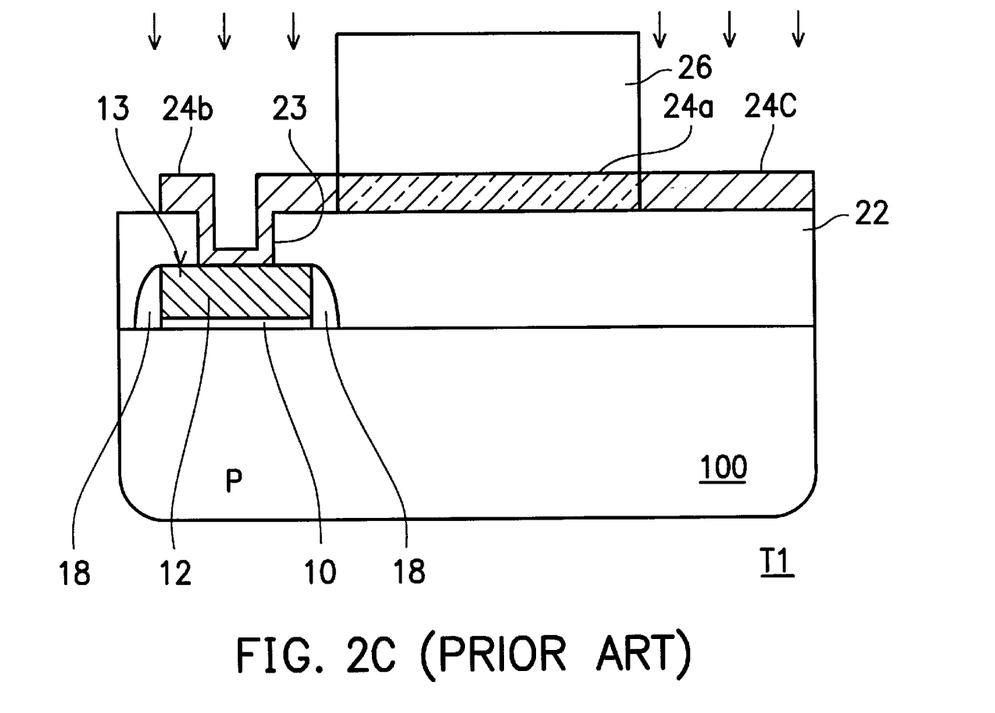

Referring to FIG. 2C, a photoresist layer 26 is formed over the polysilicon layer 24 and is patterned to define the region of the load. The region covered by the photoresist layer 26 is a lightly-doped load 24a. Other regions of the polysilicon layer 24 uncovered by the photoresist layer 26 are then implanted with N+ ions to be connectors 24b and 24c. The photoresist layer 26 is removed after the ion implantation step, thereby producing the structure of FIG. 2D.

Figure 2D:
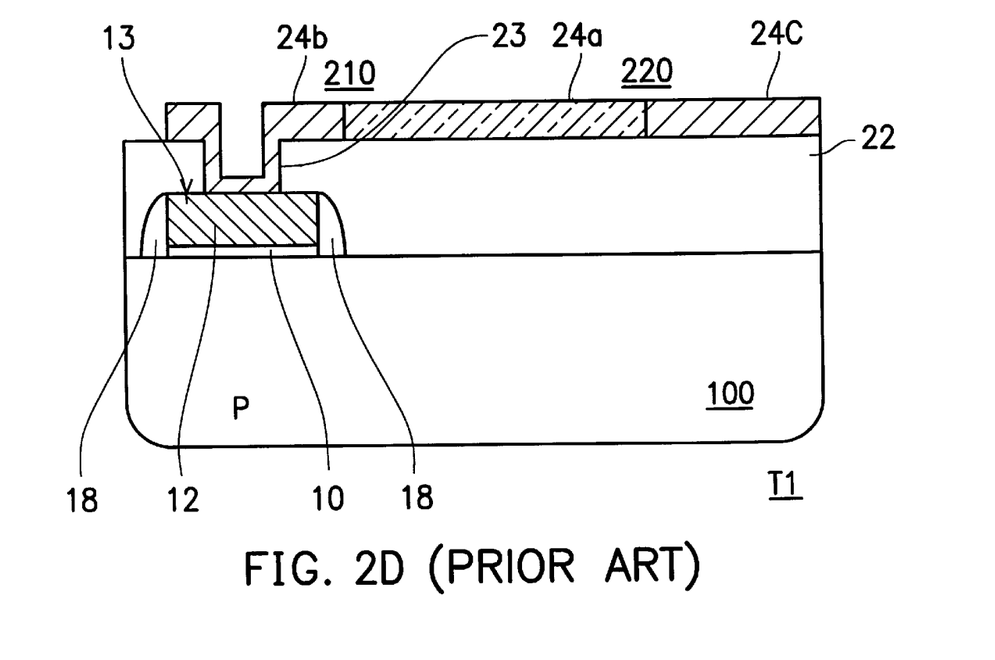

Referring to FIG. 2D and FIG. 1, load 24a (R2) has an end 210 electrically connected to gate 13 (G1) of transistor T1 and N-type lightly-doped drain D1 of transistor T2 through connector 24b, which is equivalent to node B of FIG. 1. The other end of the load 24a (R2) is connected to voltage source Vcc through connector 24c.

Figure 3A:
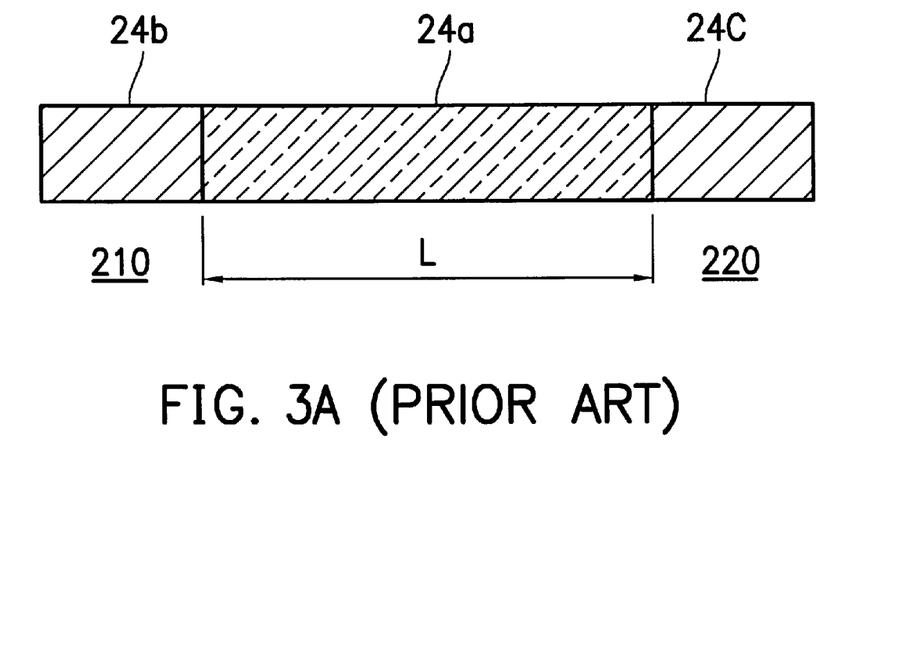
FIG. 3A and FIG. 3B are schematic diagrams illustrating a lateral diffusion effect on the length of the load of FIG. 2A through FIG. 2D due to post-thermal processes.
Figure 3B:
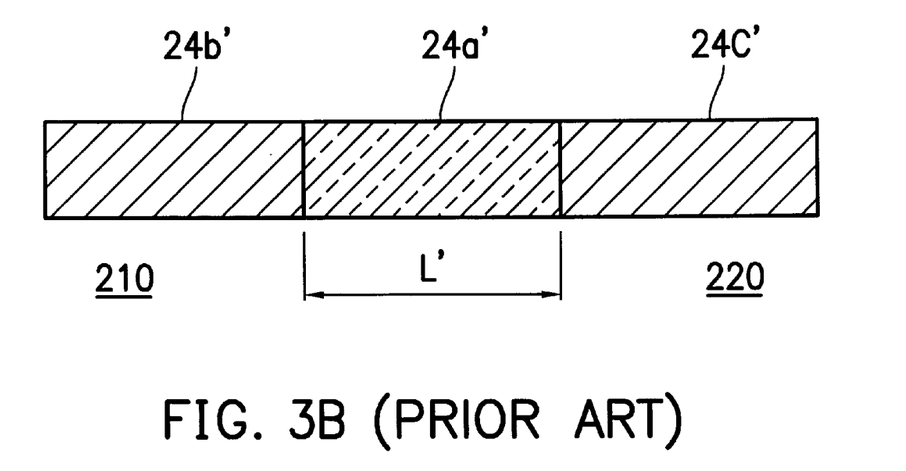

However, referring to FIG. 3A and FIG. 3B, since the load 24a and connectors 24b and 24c are formed by implanting ions of different concentrations therein, lateral diffusion will happen at joints 210 and 220 of the connectors 24b, 24c and the load 24a when the thermal cycling of back-end processes is carried out. For example, referring to FIG. 3B, the heavily-doped connectors 24b and 24c are expanded to 24b' and 24c', thereby reducing the length L of the load 24a to L'. The shortened load 24a' may easily induce punch-through. Therefore, the dimension of the SRAM cannot be decreased or the performance of the SRAM may be affected.

SUMMARY OF THE INVENTION

Accordingly, the present invention provides a method for fabricating loads of an SRAM memory unit by the metal silicide process.

The method of the invention utilizes a thermal annealing process to form the silicide loads for isolating the load and a connector.

The method of the invention fabricates a load on a substrate. A dielectric layer is first formed to overlie the substrate, and then patterned to form a window exposing a portion of the substrate. Thereafter, a metal plug is filled into the window, and a conducting layer is deposited over the substrate. Subsequently, by subjecting to a thermal process, the metal plug reacts with the conducting layer to form a silicide interface. Finally, a predetermined length of the conducting layer from the silicide interface is defined as a load.

According to the invention, the method for fabricating a load in an SRAM memory unit over a substrate, a transistor is first fabricated on the substrate. The transistor is provided with a gate and a diffusion region. A dielectric layer is formed over the substrate, and then patterned to form a window exposing a portion of the substrate surface. A refractory metal layer is deposited over the substrate and filling in the window Then, the refractory metal layer is etched back to form a plug remaining in the window. Thereafter, the step of forming a polysilicon layer over the substrate is followed. By applying a rapid thermal process, the plug reacts with the polysilicon layer to form a silicide interface. Finally, a predetermined length of the polysilicon layer abutting the silicide interface is defined, which serves as a load.

DETAILED DESCRIPTION OF THE INVENTION

Figure 4A:
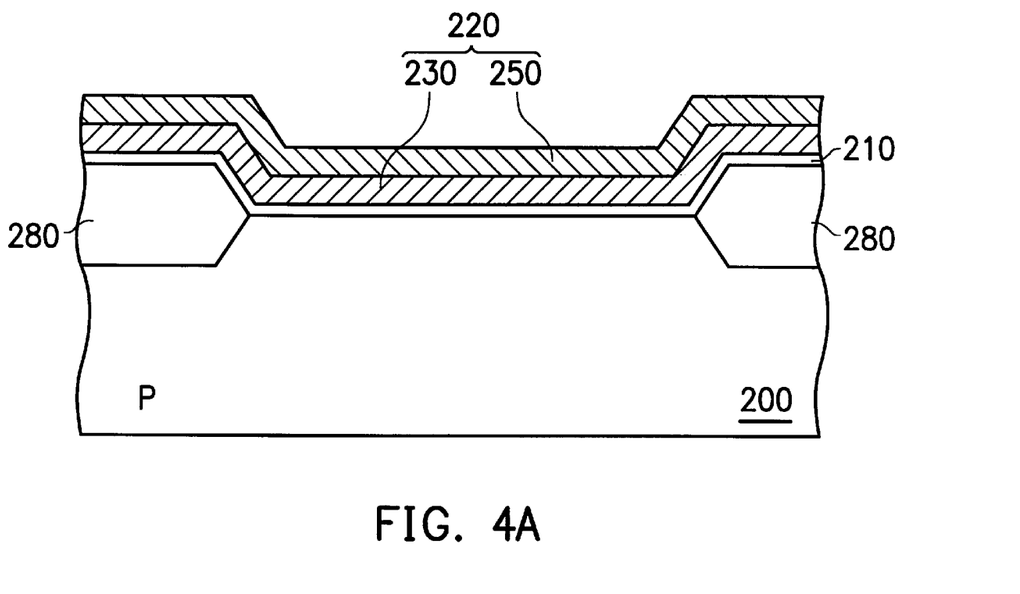
FIG. 4A through FIG. 4I are cross-sectional views illustrating the steps for forming a load in an SRAM memory unit according to an embodiment of the invention.

Referring to FIG. 4A, the embodiment of the invention is applied over a semiconductor substrate 200. The semiconductor substrate 200 can be a 100-oriented P-type silicon substrate, a P-type well, an epitaxial layer, or a silicon-on-insulator (SOI). In the embodiment, the semiconductor substrate 200 is defined to have an active region by, for example, an ion implantation step, an anneal step, an oxidation step, and another ion implantation step. The first ion implantation step implants impurities such as $BF_3$ in the substrate 200. The implanted boron ions diffuse to form a P-type well in the substrate 200 after the anneal step. The oxidation step can be a local-oxidation on silicon (LOCOS) step which forms a dielectric layer 280 as a field insulator over the substrate 200, thereby defining an active region. The second ion implantation step is a blanket implantation for adjustment of the threshold voltage.

Then an insulating layer 210 and a conducting layer 230 are successively formed over the substrate 200. Since the insulating layer 210 is provided as a gate dielectric layer, it is preferably formed by a hot oxidation process such as dry oxidation at a temperature of about 900° C. The conducting layer 230 can be a polysilicon layer which is formed by, for example, reacting $SiH_4$ gas through a low-pressure chemical vapor deposition (LPCVD) process. The deposited polysilicon layer 230 has a preferred thickness of about 1000 Å. Since the polysilicon layer 230 is provided for a gate, its conductivity can be improved by diffusing or implanting phosphorus or arsenic ions therein.

Moreover, the conductivity can be further improved by forming a silicide layer over the conducting polysilicon layer 230. For example, a titanium silicide or a tungsten silicide layer can be formed over the polysilicon layer 230 as a polycide layer. Since a phosphorus-silicon glass layer exists between the silicide and the polysilicon layer due to the impurities in the polysilicon layer, the polysilicon surface is preferably processed by HF solution. The tungsten silicide layer can be formed by an LPCVD method in which tungsten hexafluoride and $SiH_4$ gases are utilized. For transforming the deposited silicon-rich tungsten silicide layer into a tungsten-rich tungsten silicide layer, an annealing step can be carried out.

Figure 4B:
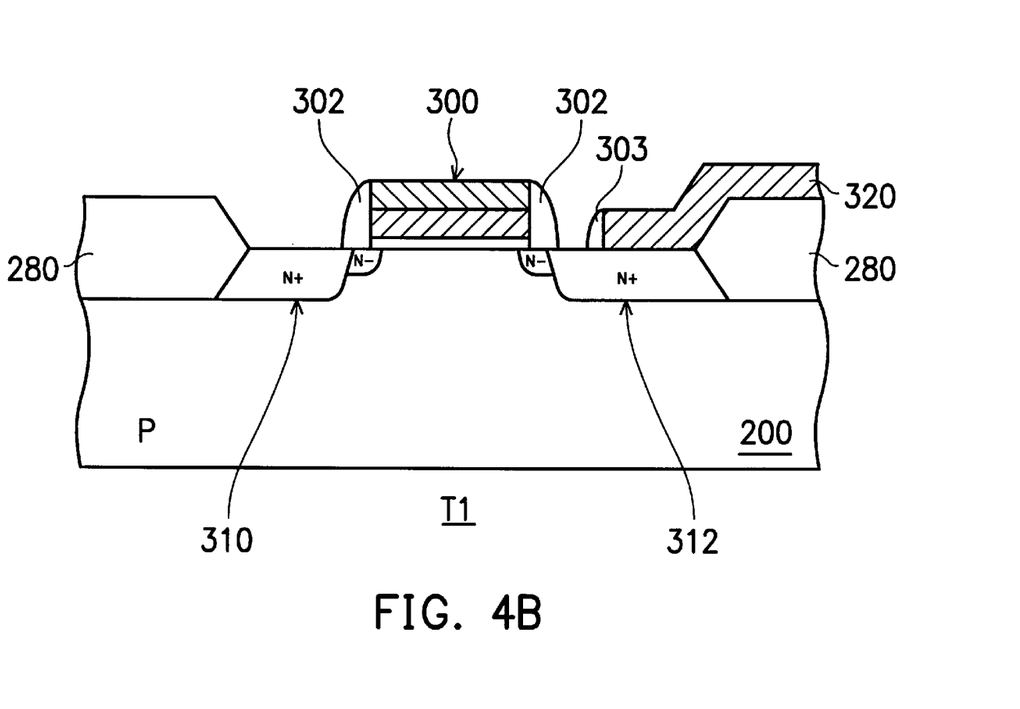

Referring to FIG. 4B, the polycide layer 220 is then defined as a gate 300 and an interconnection line 320 by successively performing a microlithography step and an etching step. The etching step is an anisotropic dry etching step in which $CF_4$, $SF_6$, $Cl_2$ and HCl gases are utilized to etch the tungsten silicide layer 250, and $Cl_2$, HCl and $SiCl_2$ gases are utilized to etch the polysilicon layer 230. Moreover, a plasma over etch is carried out to completely remove exposed polycide 220.

Then a transistor T1 is formed by deposition, microlithography and ion implantation steps. The transistor T1 includes a gate 300 and two N-type diffusion regions 310 and 312. Moreover, dielectric spacers 302 and 303 are formed on sidewalls of the gate 300 and the interconnection line 320. The interconnection line 320 is electrically connected to the N-type diffusion region 312.

Figure 4C:
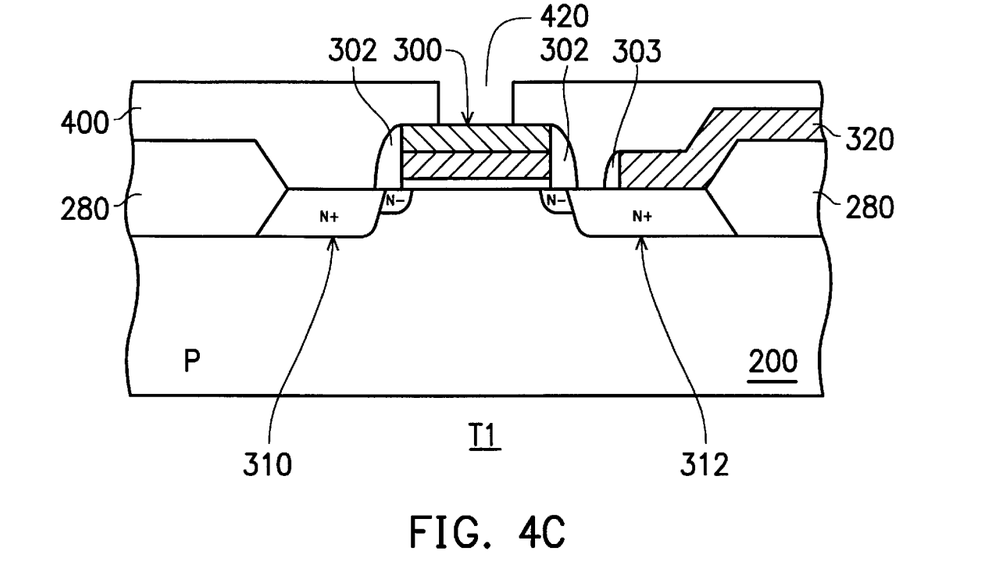

Referring to FIG. 4C, an insulating layer 400 is formed over the substrate. The insulating layer 400 is a thermal oxide layer or a CVD oxide layer. For example, the oxide layer can be formed by reacting tetra-ethyl-ortho-silicate (TEOS) through an LPCVD process. The insulating layer 400 can also be a BPSG layer which is formed by, for example, reacting TEOS, $O_3/O_2$, tri-ethyl-borate (TEB) and tri-methyl-phosphate (TMP) through an atmospheric-pressure chemical vapor deposition (APCVD) process. The thickness of the insulating layer 400 is preferably about 1000–10000 Å.

The insulating layer 400 is then defined through a microlithography step and an etching step to form a contact window 420. The etching step can be a reactive ion etch step which anisotropically etches the insulating layer 400 by $CHF_3$ gas, thereby forming the window 420 in which a portion of the gate 300.

Figure 4D:
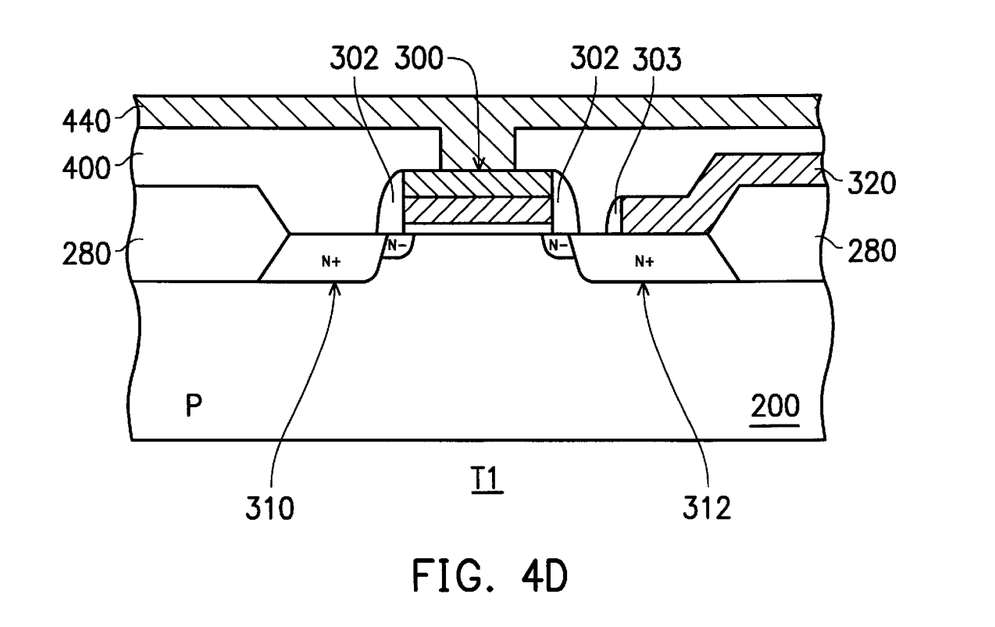

Referring to FIG. 4D, a metal layer 440 is formed over the substrate. The metal layer 440 is a refractory metal such as a platinum, cobalt, or titanium layer. In the embodiment, a titanium layer can be formed by physical vapor deposition (PVD) or chemical vapor deposition (CVD). The titanium layer is formed by, for example, magnetron DC sputtering to a thickness of about 100–2000 Å, thereby filling in the contact window.

Figure 4E:
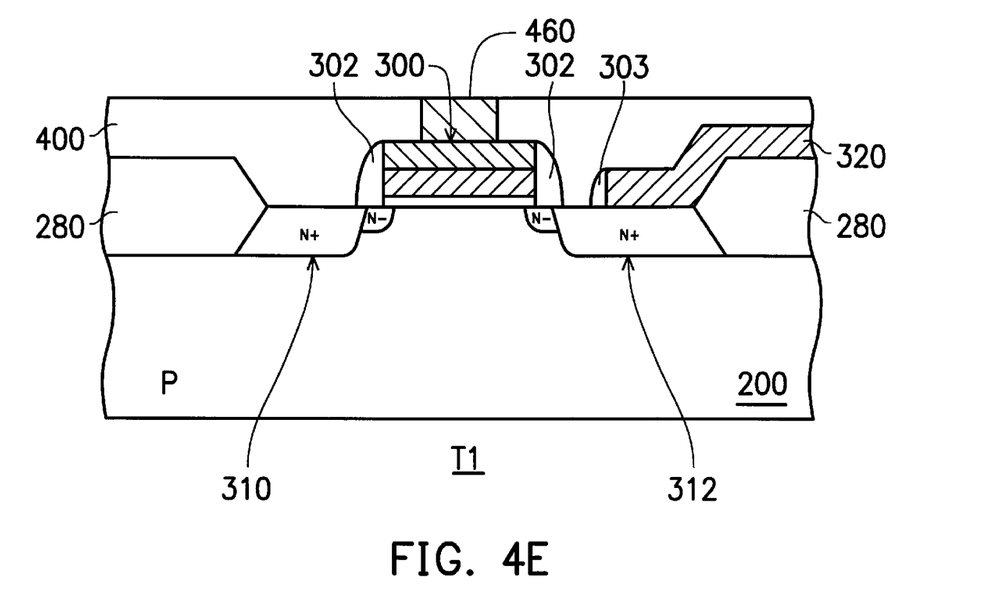
Figure 4F:
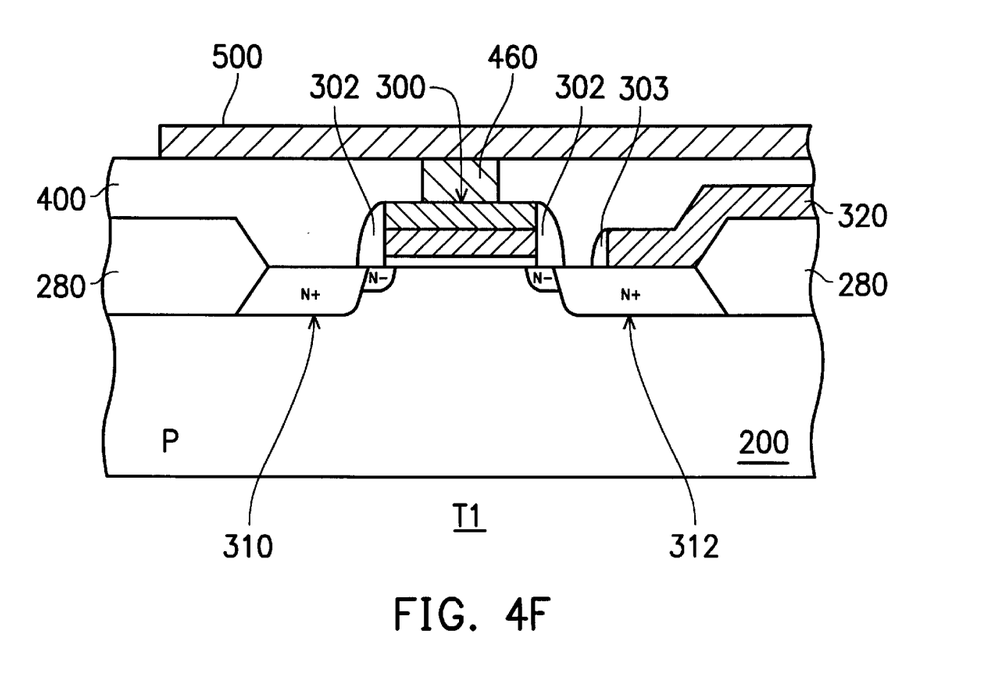

Referring to FIG. 4E, the metal layer 440 is etched back to form a plug 460 in the contact window 420. For a titanium layer 440, a dry etch step in which $BCl_3/Cl_2$ or $CCl_4$ gases are utilized is carried out to remove the titanium layer 440 to the insulating layer 400, thereby leaving a titanium plug 460 in the contact window 420. Referring to FIG. 4F, a conducting layer 500 is formed over the substrate. The conducting layer 500 can be a polysilicon layer which is formed by, for example, reacting $SiH_4$ gas through an LPCVD process. The deposited polysilicon layer 500 has preferably a thickness of about 2000 Å. The polysilicon layer 500 is defined as a load and a connector by a microlithography step.

Figure 4G:
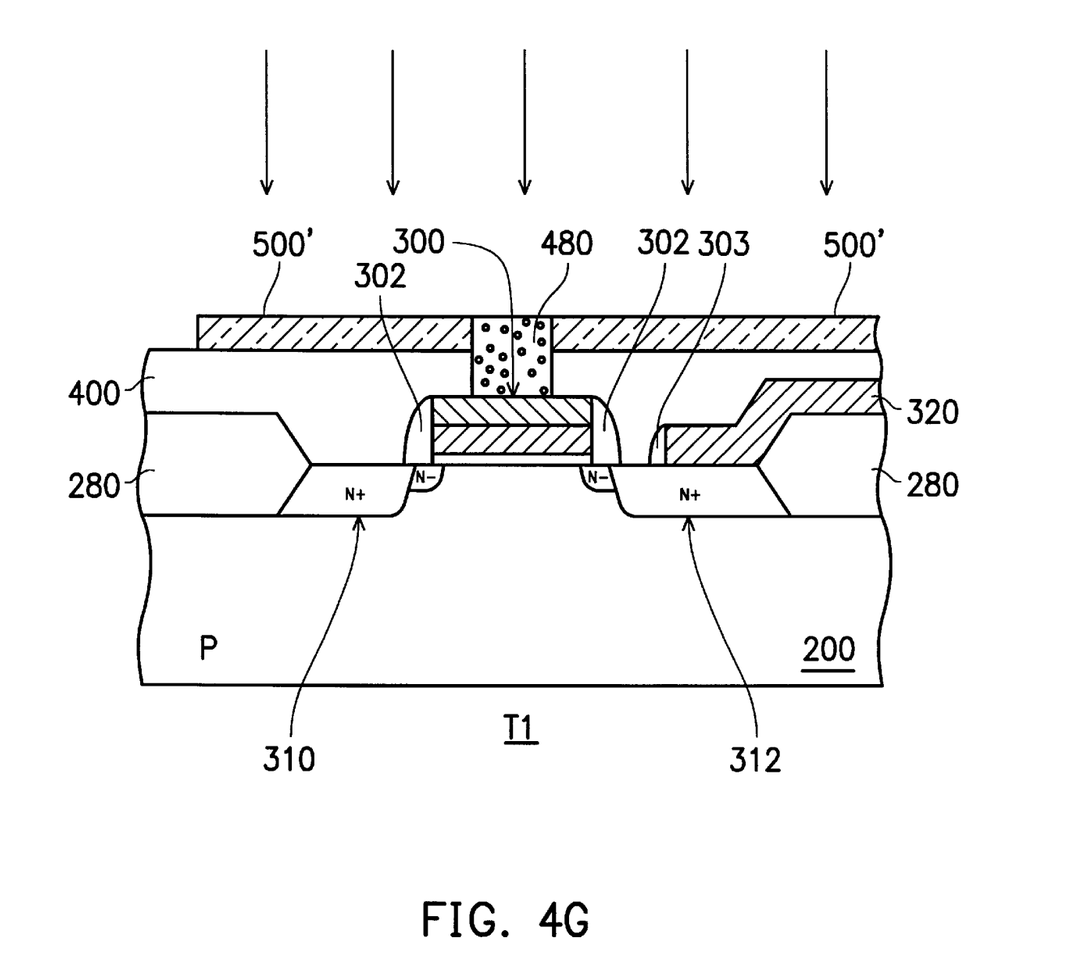

Referring to FIG. 4G, a silicide interface 480 is formed by an ion implantation and a thermal annealing step. Since a portion of the conducting layer 500 is provided for the load, the conducting layer 500 can be a lightly-doped N$^-$ polysilicon which is processed by a blanket implantation. That is, the polysilicon layer 500 is lightly implanted or diffused with phosphorus or arsenic ions. As the refractory metal such as titanium is a good material for oxygen gettering, it easily reacts with silicon, thereby forming low-resistance silicide (e.g., titanium silicide $TiSi_2$). Therefore, a self-aligned silicide (salicide) process in which the plug 460 and the conducting layer 500 react and form a silicide layer can be carried out, at a temperature of 500–1200° C., to form the silicide interface 480.

Figure 4H:
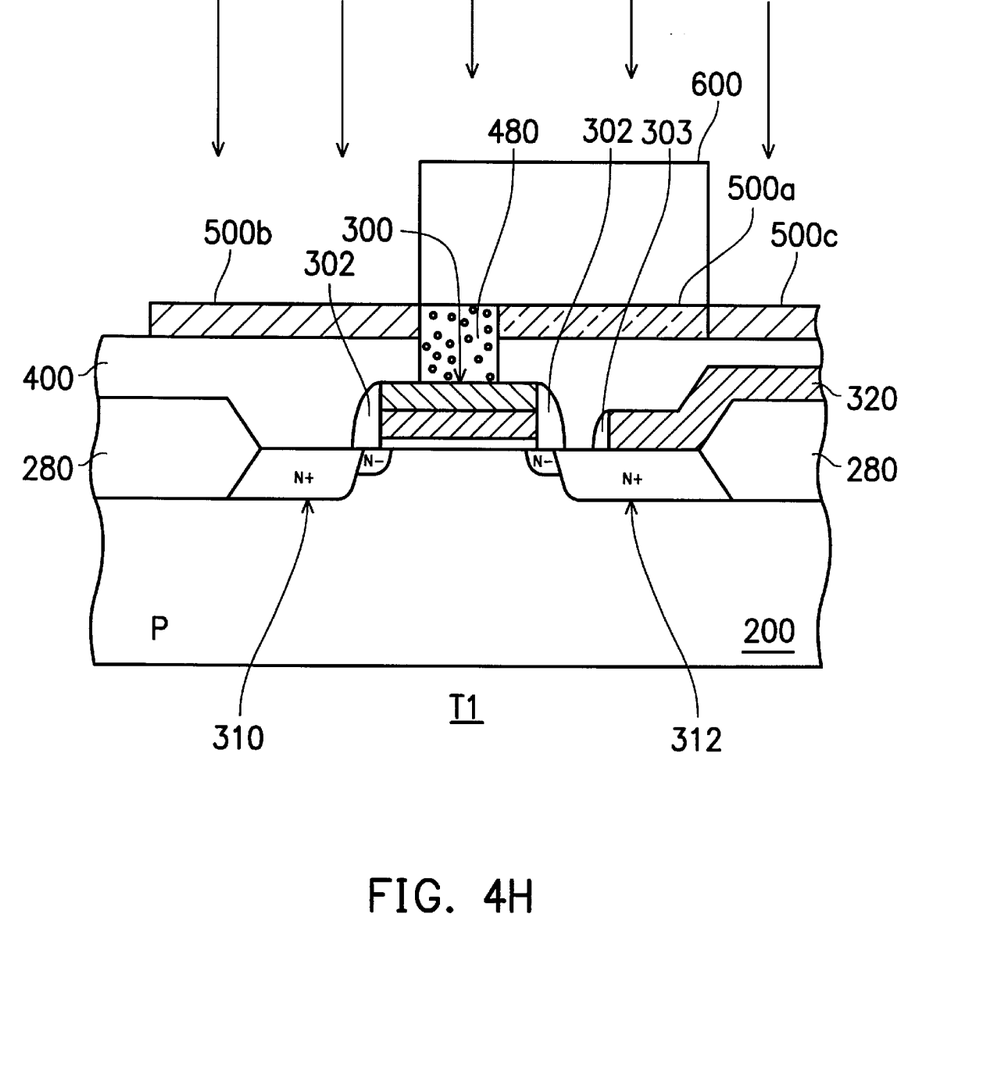

Referring to FIG. 4H, a photoresist layer 600 is formed over the conducting layer 500 to define a load 500a and two connector 500b and 500c. In the embodiment, a predetermined length of the conducting layer 500 from the silicide interface 480 is defined as the load 500a. Then a blanket implantation is carried out to implant phosphorus or arsenic ions in uncovered portions of the polysilicon layer 500, thereby forming the heavily-doped N$^+$ connectors 500b and 500c.

Figure 4I:
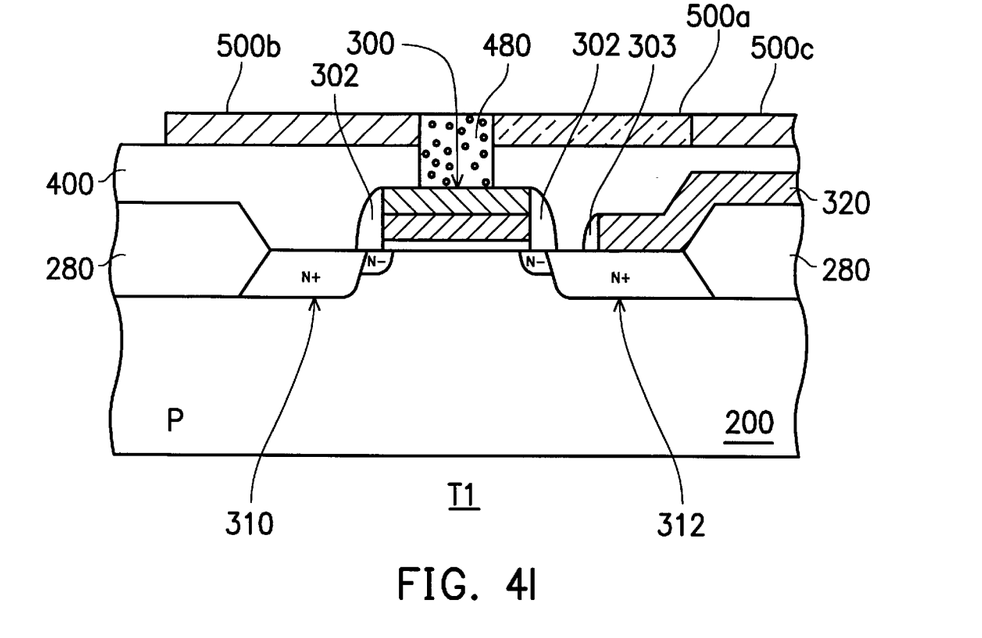

Then a dry etch step such as plasma etching, and a wet etch step in which organic or inorganic solution is utilized are carried out to completely remove the photoresist layer 600. Therefore, the load 500a is formed over the substrate, as shown in FIG. 4I.

Figure 5:
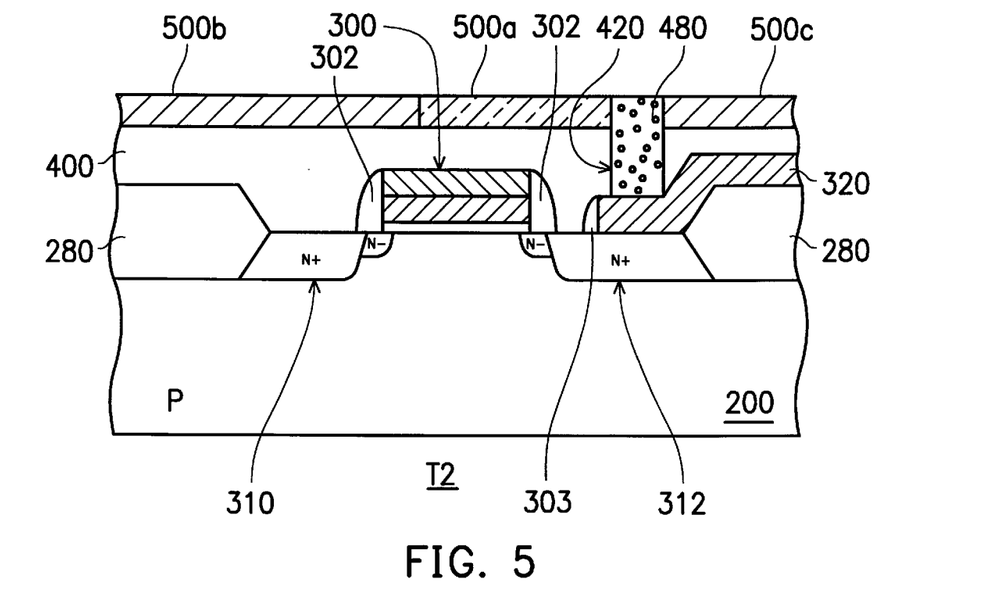
FIG. 5 is a cross-sectional view illustrating another embodiment of the invention.

Referring to FIG. 5, another embodiment of the invention is illustrated. The embodiment forms a contact window 420 through the insulating layer 400 to expose a portion of the drain interconnection line 320. Then the load 500a and the connectors 500b and 500c are formed thereon. In the present embodiment, the steps are similar to those of the previous embodiment except for the pattern defining the contact window 420. For a structure without the interconnection line 320, the contact window can be formed to expose the drain 312, thereby electrically connecting the plug 480 to the drain 312.

Figure 6:
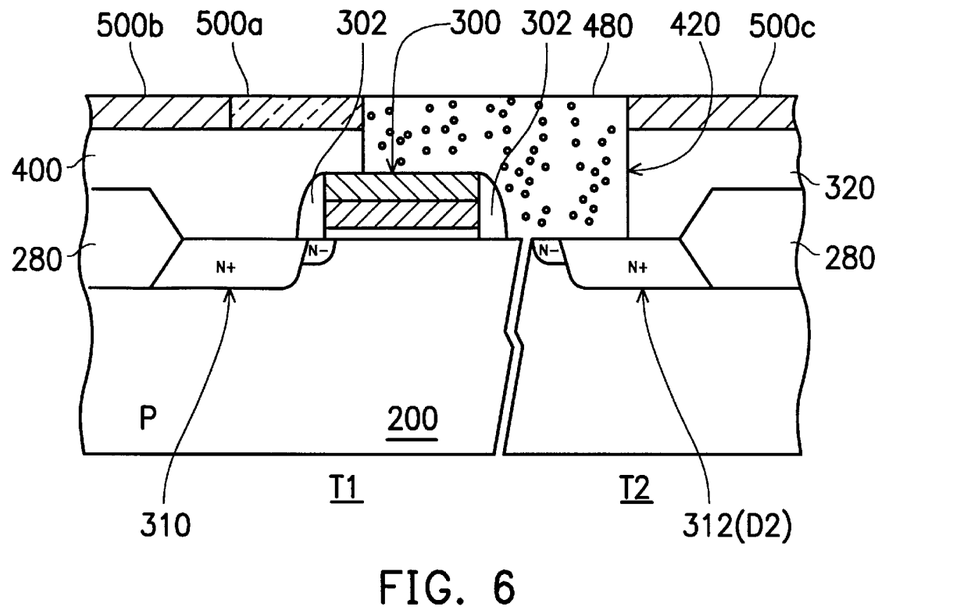
FIG. 6 is a cross-sectional view illustrating yet another embodiment of the invention.

Moreover, referring to FIG. 6, a butting contact window 420 is formed through the insulating layer 400 to expose both the gate 300 of transistor T1 and the drain 312 of the transistor T2. The other steps in the embodiment are similar to those of the two previous embodiments. Therefore, a predetermined length of the conducting line 500 from the plug 480 is defined as the load 500a, and other regions of the conducting line are connectors 500b and 500c.

The standard SRAM processes are then carried out. For example, an ESD layer and an insulating layer such as an oxide layer or a BPSG layer are successively formed over the structure of FIG. 4I, FIG. 5 or FIG. 6. These layers are etched to form a window in which the source region is exposed. The window is filled with a metal plug which extends over the structure to connect a voltage source Vss. The structure is finally covered with a passivation layer. As these conventional steps are known to those skilled in the art, they are omitted in the figure.

Figure 7:
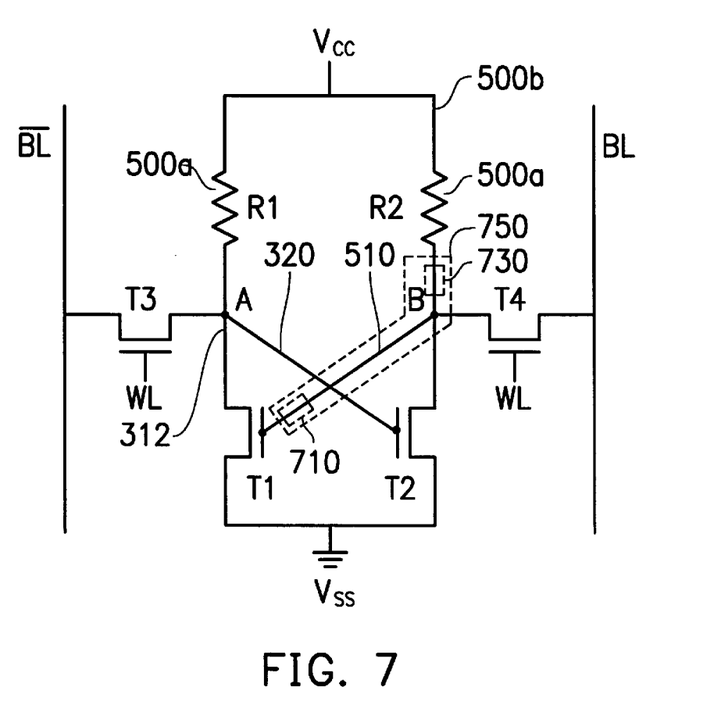
FIG. 7 is a circuit diagram of the memory unit of the invention.

Referring to FIG. 7, the circuit diagram of the SRAM of the invention is illustrated. If a portion of the substrate in FIG. 4I is the transistor T1, the silicide interface 480 is equivalent to block 710 which electrically connects the load 500a from the gate 300 of transistor T1. If a portion of the substrate in FIG. 5 is transistor T2, the silicide interface 480 is equivalent to block 730 which electrically connects the load 500a from drain 312 of transistor T2. Alternatively, if a portion of the substrate of FIG. 6 is transistor T1 and T2, the silicide interface 480 is equivalent to block 750 which is a butting structure connecting the gate 300 of transistor T1, drain 312 of transistor T2 and the load 500a.

Accordingly, the silicide interface 480 is the node B which electrically connects the gate 300 of transistor T1, the drains (D2, D4) of transistors T2 and T4, and load 500a. The load 500a further connects to a voltage source Vcc through connector 500c.

The gates of transistors T3 and T4 both connect to a word line WL. The sources of the transistors T3 and T4 connect to a bit line BL and a complementary bit line BL, respectively. In the SRAM unit, the transistors T1 and T2 are drivers, whereas the transistors T3 and T4 are transfer transistors. The loads R1 and R2 are provided for reducing charge leakage at the nodes A and B.

Figure 8A:
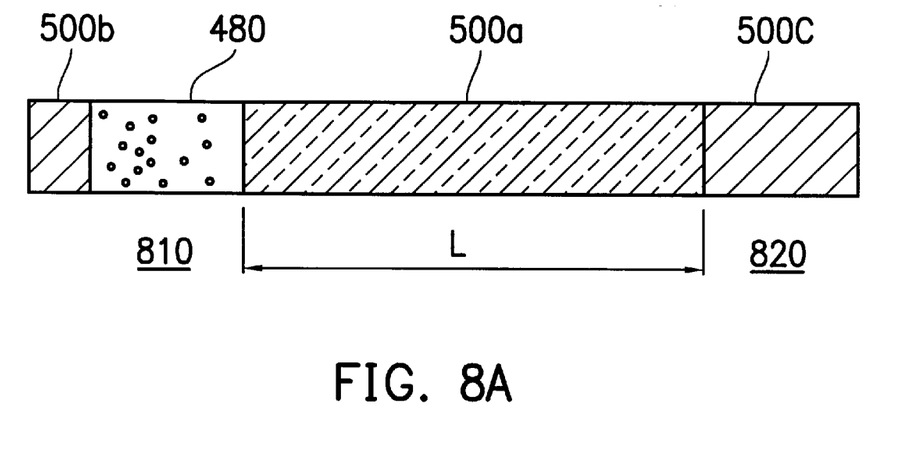
FIG. 8A and FIG. 8B are schematic diagrams illustrating the lateral diffusion effect on the load fabricated by the method of the invention.
Figure 8B:
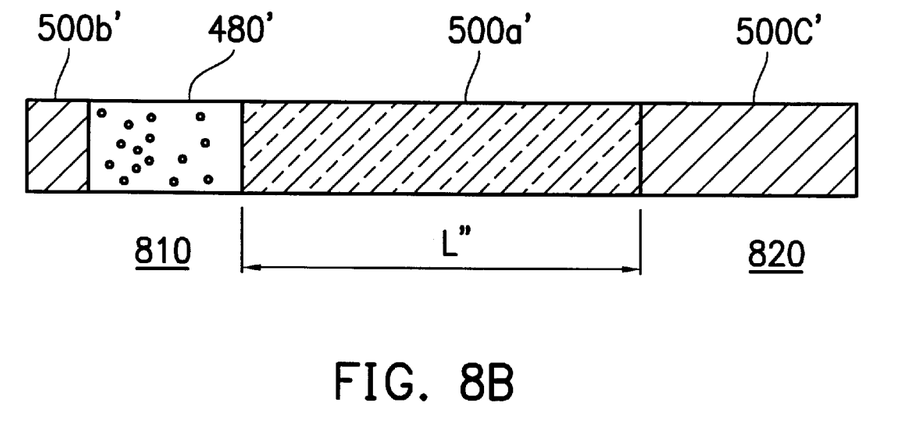

Referring to FIG. 8A and FIG. 8B, the lateral diffusion effects on the length of the load 500a are illustrated. In the invention, since one end of the lightly doped N⁻ load 500a abuts the silicide interface 480 and is thereby isolated from the heavily-doped N⁺ connector 500b, the lateral diffusion can hardly occur during the thermal cycling of back-end processes, and the predetermined length L of the load 500a is barely affected. For example, referring to FIG. 8B, which shows the effect of such thermal cycling, the silicide interface 480 at 810 side prevents the lateral diffusion of impurities from the connector 500b into the load 500a. Therefore, only the 820 side of the load 500a is affected. The shortened length L" of the load 500a is still longer than that of the conventional load structure.

The invention therefore provides the advantages of:
1. Lateral diffusion on the length of the load can be prevented by the silicide interface, thereby retaining the predetermined length of the load.
2. The SRAM unit has higher resistance to punch-through as the load is long enough.
3. The silicide interface is simple enough and compatible with the conventional SRAM process.

What is claimed is:

1. A method for fabricating a load on a substrate, comprising the steps of:
   forming a dielectric layer over the substrate;
   patterning the dielectric layer to form a window in which a portion of the substrate is exposed;
   forming a metal plug in the window;
   forming a conducting layer over the substrate;
   thermally processing the metal plus and the conducting layer, thereby forming a silicide interface; and
   defining a predetermined length of the conducting layer as a load, with a first end of the predetermined length of the conducting layer abutting against the silicide interface.

2. The method as claimed in claim 1, wherein the metal plug is formed by the steps of:
   forming a metal layer over the substrate and filling in the window; and etching back the metal layer to the surface of the dielectric.

3. The method as claimed in claim 2, wherein the metal layer is a refractory metal layer.

4. The method as claimed in claim 3, wherein the refractory metal layer is a layer selected from the group of platinum, cobalt, and titanium.

5. The method as claimed in claim 1, wherein the dielectric layer is a silicon dioxide layer.

6. The method as claimed in claim 1, wherein the conducting layer is a polysilicon layer.

7. The method as claimed in claim 1, wherein the metal plug and the conducting layer are thermally processed through a rapid thermal process (RTP).

8. A method for fabricating a load in an SRAM memory unit over a substrate, comprising the steps of:
   forming a transistor including a gate and a diffusion region on the substrate;
   forming a dielectric layer over the substrate;
   patterning the dielectric layer to form a window to expose a portion of the substrate surface;
   forming a refractory metal layer over the substrate and filling in the window;
   etching back the refractory metal layer to form a plug in the window;
   forming a polysilicon layer over the substrate;
   rapid thermal processing the plug and the polysilicon layer to form a silicide interface; and
   defining a predetermined length of the polysilicon layer as a load, with a first end of the predetermined length of the conducting layer abutting against the silicide interface.

9. The method as claimed in claim 8, wherein the substrate is a P-type silicon substrate.

10. The method as claimed in claim 8, wherein the dielectric layer is a silicon dioxide layer.

11. The method as claimed in claim 8, wherein the polysilicon layer is lightly doped.

12. The method as claimed in claim 8, wherein the silicide interface abuts adjacent polysilicon due to the rapid thermal processing step and wherein the predetermined length of the polysilicon layer is defined by the steps of:

forming a photoresist layer over the polysilicon layer;

patterning a predetermined length of the photoresist layer, the predetermined length of the photoresist covering the silicide interface and a portion of the polysilicon layer including where it abuts the silicide interface;

implanting ions into the polysilicon layer by using the photoresist layer as a mask; and removing the photoresist layer.

13. The method as claimed in claim 8, wherein the window is formed through the dielectric layer to the gate of the transistor.

14. The method as claimed in claim 8, wherein the window is formed through the dielectric layer to the diffusion region of the transistor.

15. A method for fabricating a load in an SRAM memory unit on a substrate, comprising the steps of:

forming a first transistor and a second transistor on the substrate, wherein the first transistor and the second transistor both include a gate and a drain region;

forming a dielectric layer over the substrate;

patterning the dielectric layer to form a window to expose a portion of the drain regions of the first transistor and the second transistor;

forming a titanium layer over the substrate and filling in the window;

etching back the titanium layer to the surface of the dielectric layer, thereby forming a plus in the window;

forming a polysilicon layer over the substrate;

rapid thermal processing the plug and the polysilicon layer to form a titanium silicide interface; and defining a predetermined length of the polysilicon layer as a load with a first end of the predetermined length of the conducting layer abutting against the silicide interface.

16. The method as claimed in claim 15, wherein the substrate includes a P-type well.

17. The method as claimed in claim 16, wherein the drain regions are N-type diffusion regions.

18. The method as claimed in claim 15, wherein the titanium layer has a thickness of about 100–2000 Å.

19. The method as claimed in claim 15, wherein the polysilicon layer has a thickness of about 100–2000 Å.

20. The method as claimed in claim 15, wherein the plug and the polysilicon layer are thermally processed at a temperature of about 500–1200° C.

* * * * *